United States Patent
Kouwa et al.

[11] Patent Number: 5,932,993
[45] Date of Patent: Aug. 3, 1999

[54] CONTROL DEVICE FOR A VEHICLE GENERATOR

[75] Inventors: Tatsuki Kouwa; Keiichi Komurasaki, both of Tokyo, Japan

[73] Assignee: Mitsubishi Denki Kabushiki Kaisha, Tokyo, Japan

[21] Appl. No.: 08/838,744

[22] Filed: Apr. 11, 1997

[30] Foreign Application Priority Data

Oct. 29, 1996 [JP] Japan ................................. 8-286675

[51] Int. Cl.$^6$ .................................................. H02J 7/14
[52] U.S. Cl. ........................................ 322/36; 257/678
[58] Field of Search ................................ 322/17, 21, 36, 322/37; 257/678

[56] References Cited

U.S. PATENT DOCUMENTS

| | | | |
|---|---|---|---|
| 4,612,493 | 9/1986 | Katashima et al. | 320/64 |
| 4,739,243 | 4/1988 | Iwatani et al. | 322/10 |
| 5,365,161 | 11/1994 | Inoue et al. | 323/282 |
| 5,432,471 | 7/1995 | Majumdar et al. | 327/380 |
| 5,473,191 | 12/1995 | Tanaka | 257/680 |

FOREIGN PATENT DOCUMENTS 460 554  12/1991  European Pat. Off. .

*Primary Examiner*—Thomas M. Dougherty
*Assistant Examiner*—Nicholas Ponomarenko
*Attorney, Agent, or Firm*—Sughrue, Mion, Zinn, Macpeak & Seas, PLLC

[57] ABSTRACT

A control device for a vehicle generator which includes a semiconductor switching element for controlling the flow of current in a field winding of a generator driven by a vehicle internal combustion engine; a control unit which outputs a control signal for turning the semiconductor switching element on and off to thereby control the output voltage of the generator; and a field current detecting element for detecting the field current. The control unit has a field current limiter which outputs the control signal, depending on the output from the field current detecting element. The field current detecting element and the field current limiter are constituted as a hybrid integrated circuit. The field current detecting element and the field current limiter have respective ground patterns coupled at a location other than the ground terminal of the hybrid integrated circuit.

2 Claims, 3 Drawing Sheets

CONTROL DEVICE FOR A VEHICLE GENERATOR

BACKGROUND OF THE INVENTION

1. Field Of The Invention

The present invention relates to a control device for a vehicle generator.

2. Discussion Of Background

As a control device for a vehicle generator there has been known the one which is disclosed in JP-A-62-104500(U.S. Pat. No. 4,739,243). In FIG. 2, there is shown the structure of the conventional control device for a vehicle generator. In this Figure, reference numeral 1 designates an a.c. generator which is driven by an internal combustion engine not shown, and which comprises armature windings 101 and a field winding 102. Reference numeral 2 designates a rectifier which rectifies the output from the a.c. generator in a full-wave, and which comprises a main output terminal 201, a voltage detecting output terminal 202 and a ground (earth) terminal 203. Reference numeral 3 designates a voltage regulator which adjusts the output from the a.c. generator 1 at a predetermined value, and whose structure and operation will be described later on. Reference numeral 4 designates a battery. Reference numeral 5 represents various electrical loads of the vehicle. Reference numeral 6 designates a key switch. Reference numeral 7 designates an initially exciting resistor for initially exciting the field winding 102 of the a.c. generator 1. Reference numeral 8 designates a reverse current blocking diode.

Now, the structure and operation of the voltage regulator 3 will be explained. Reference numerals 301 and 302 designate potential dividing resistors which divide the output from the voltage detecting output terminal 202 of the rectifier 2. When the divided potential is not less than the predetermined value, it causes a Zener diode 303 to conduct, allowing a transistor 304 to conduct. By conduction of the transistor 304, a transistor 305 for turning on and off the field winding 102 is driven to nonconduction to cut off a field current, thereby decreasing the output of the generator 1. When the divided potential by the potential dividing resistors 301 and 302 becomes lower than the predetermined value because of a decrease in the output of the generator 1, the Zener diode 303 is driven to nonconduction, thereby driving the transistor 304 to nonconduction as well. It causes the transistor 305 to conduct, allowing the field current to flow and the output of the generator 1 to be raised. The output from the generator 1 is adjusted so as to keep the predetermined value by repeating such operations.

When the field current flows in the field winding 102, a voltage drop is developed across a resistor 308 as a field current detecting element in proportion to the magnitude of the field current. The potential generated by the voltage drop is introduced into a comparator 310 as field current limiting means where the potential is compared with a reference voltage determined by dividing the output of a constant voltage source (not shown) by voltage dividing resistors 311 and 312. When the field current is small, the comparator 310 provides an output at a low level to have no effect on the voltage regulator 3. On the other hand, when the field current is great, the comparator 310 provides an output at a high level to flow a base current in the transistor 304 through resistors 315 and 316, and a reverse current blocking diode 317. It causes the transistor 304 to conduct and drive the transistor 305 to nonconduction, thereby cutting off the field current to decrease the output from the generator 1. When the field current is cut off, a discharge current flows from a capacitor 313, depending on a time constant determined by the capacitor 313 and a resistor 314, so the potential gradually lowers. When the potential becomes not higher than the reference voltage, the comparator 310 provides an output at a low level to cut off the base current for the transistor 304. It drives the transistor 304 to nonconduction, and it causes the transistor 305 to conduct, allowing the field current to flow so as to increase the output of the generator 1. In that manner, limiting the field current is carried out.

Usually, the voltage regulator 3 as stated earlier is constituted by a hybrid integrated circuit. As shown in FIG. 3, the transistor 305, a surge absorbing diode 307 and the field current detecting resistor 308 are constituted as discrete elements, and other parts are constituted as an IC. The voltage regulator includes a power source terminal "a", a field current controlling terminal "b" and a ground (earth) terminal "c" as terminals for external connection. The field current detecting resistor 308 and the IC have respective ground (earth) patterns coupled together at a terminal portion of the ground terminal "c".

In the conventional control device for a vehicle generator thus constructed, lead wires for taking out a signal from the hybrid integrated circuit are usually coupled by soldering. Since coupling by soldering causes contact resistance, there is provided the same situation as respective resistors are included in series between the field current detecting resistor 308 and the ground terminal "c", and between the voltage dividing resistor 312 and the ground terminal "c". In addition, the ground pattern of the field current detecting resistor 308 and the ground pattern of the IC are coupled at the terminal portion of the ground terminal "c" for external connection. This arrangement creates a problem in that each contact resistance varies depending on what soldering is made at the terminal portion, the field current detecting resistor 308 and the voltage dividing resistor 312 are unbalanced to make the ground potential for detecting the field current unstable, and limiting the field current is not carried out in an adequate manner unlike the operation of the field current limiting means stated earlier, thereby disturbing the control of the generator output, extremely raising the generator output and damaging an electrical system due to overcharge or overvoltage of the battery.

SUMMARY OF THE INVENTION

It is an object of the present invention to solve the problem of the conventional control device, and to provide a control device for a vehicle generator capable of preventing a generator output from being extraordinarily raised by adequately limiting a field current without a change in a resistance value depending on what soldering is made, and capable of preventing an electrical system from being damaged due to overcharge or overvoltage of battery.

The present invention provides a control device for a vehicle generator which comprises a semiconductor switching element for turning on and off a field current to flow in a field winding of a generator driven by a vehicle internal combustion engine; a control unit for outputting a control signal indicative of on and off of the semiconductor switching element so as to control an output voltage from the generator; a field current detecting element for detecting the field current; the control unit including field current limiting means for outputting the control signal, depending on output from the field current detecting element; and the field current detecting element and the field current limiting means being constituted as a hybrid integrated circuit; wherein the field current detecting element and the field current limiting means have respective ground (earth) patterns coupled at a location upstream of a ground terminal of the hybrid integrated circuit.

As described, in a control device for a vehicle generator according to the present invention, the field current detecting element and the field current limiting means are constituted as a hybrid integrated circuit, and the field current detecting element and the field current limiting means have respective ground patterns coupled at a location upstream of a ground terminal of the hybrid circuit. This arrangement can prevent the resistor as the field current detecting element and the voltage dividing resistor as the field current limiting means determining the reference voltage of a comparator from being unbalanced to make the ground potential for field current detection unstable, limit the field current adequately, prevent generator output from being extraordinarily raised and prevent an electrical system from being damaged due to overvoltage or overcharge of a battery even if contact resistance varies depending on what soldering is made at the terminal portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
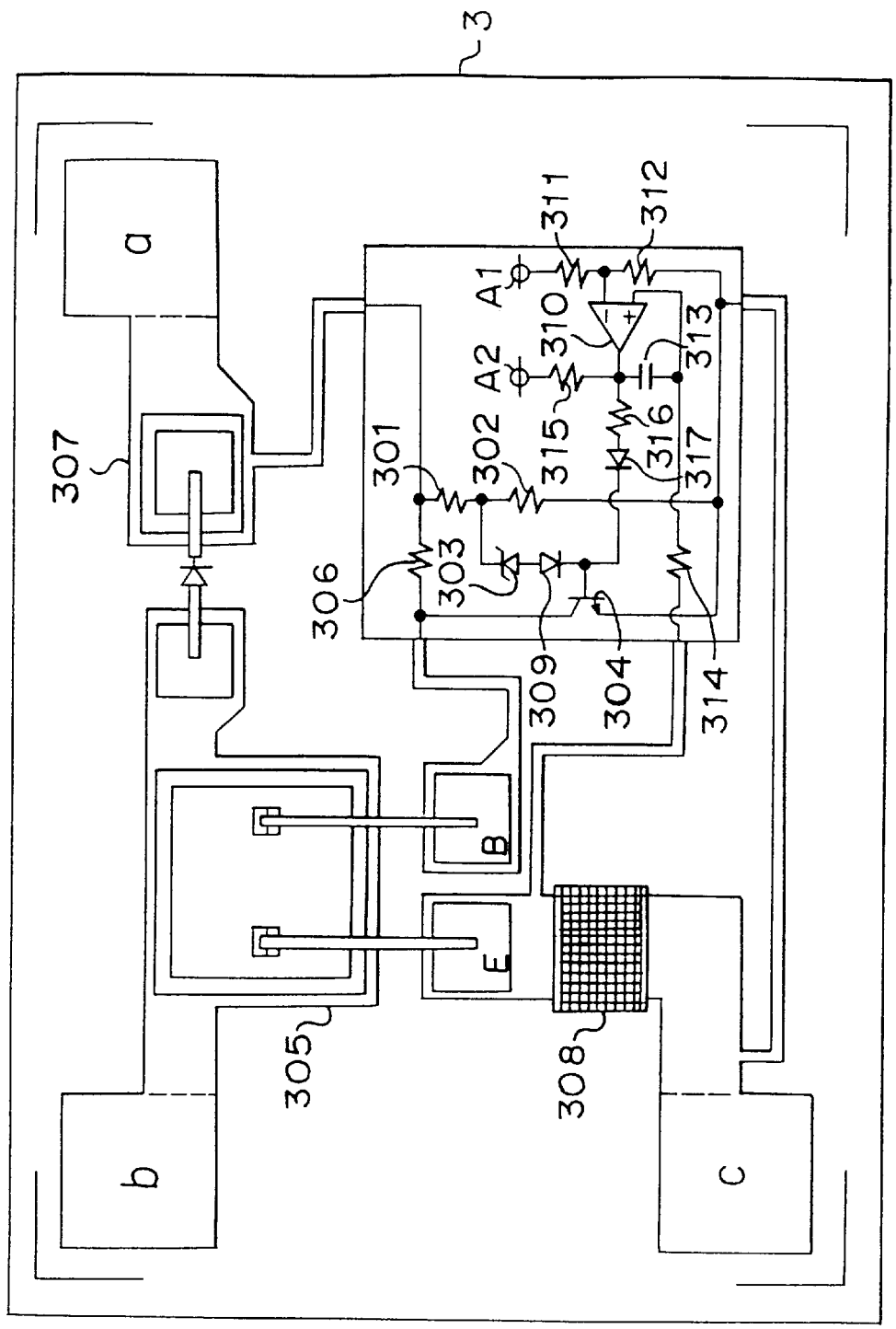
FIG. 1 is a schematic diagram showing a voltage regulator of the control device for a vehicle generator according to a first embodiment of the present invention.
Figure 2:
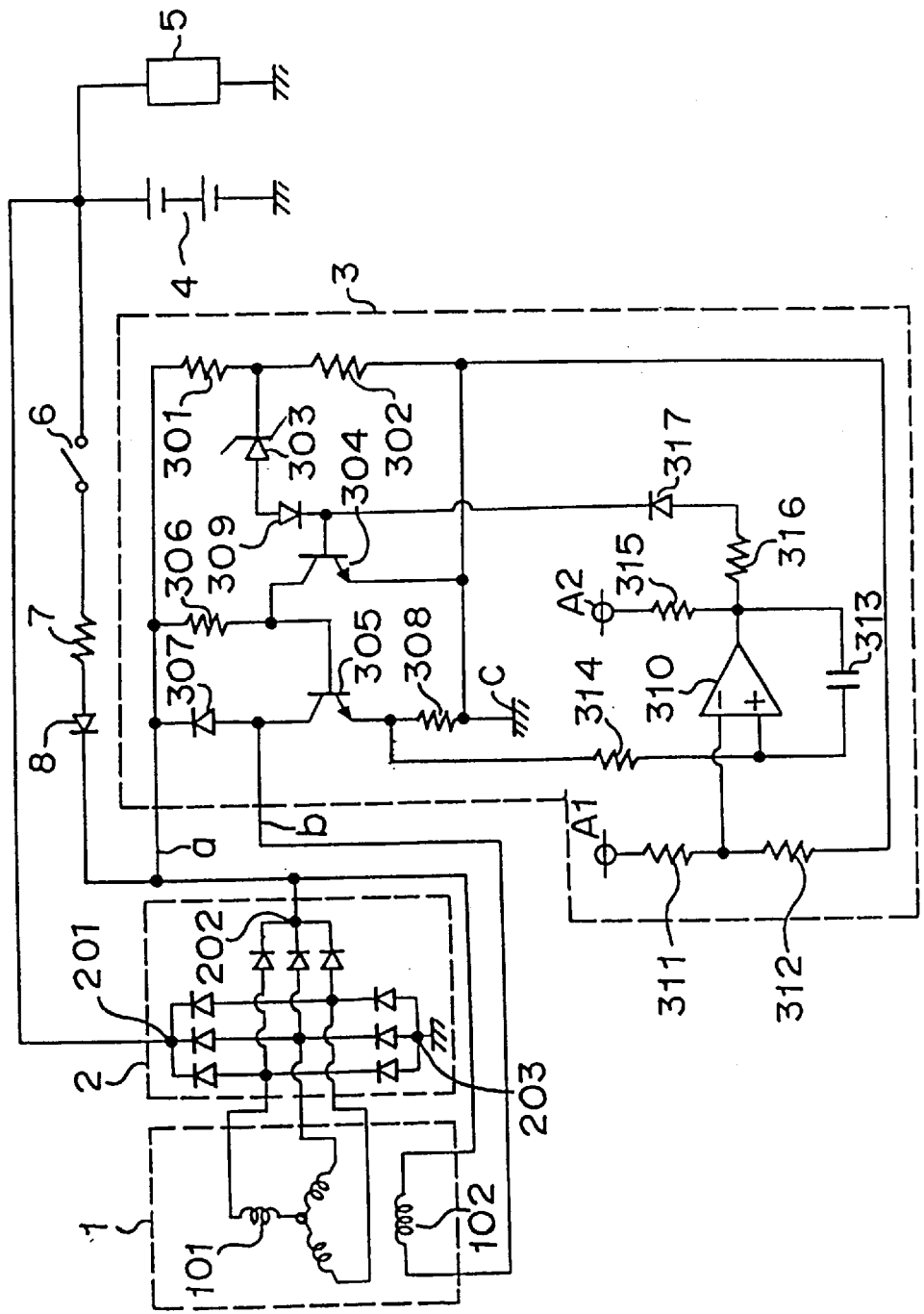
FIG. 2 is a schematic diagram of a conventional control device for a vehicle generator.
Figure 3:
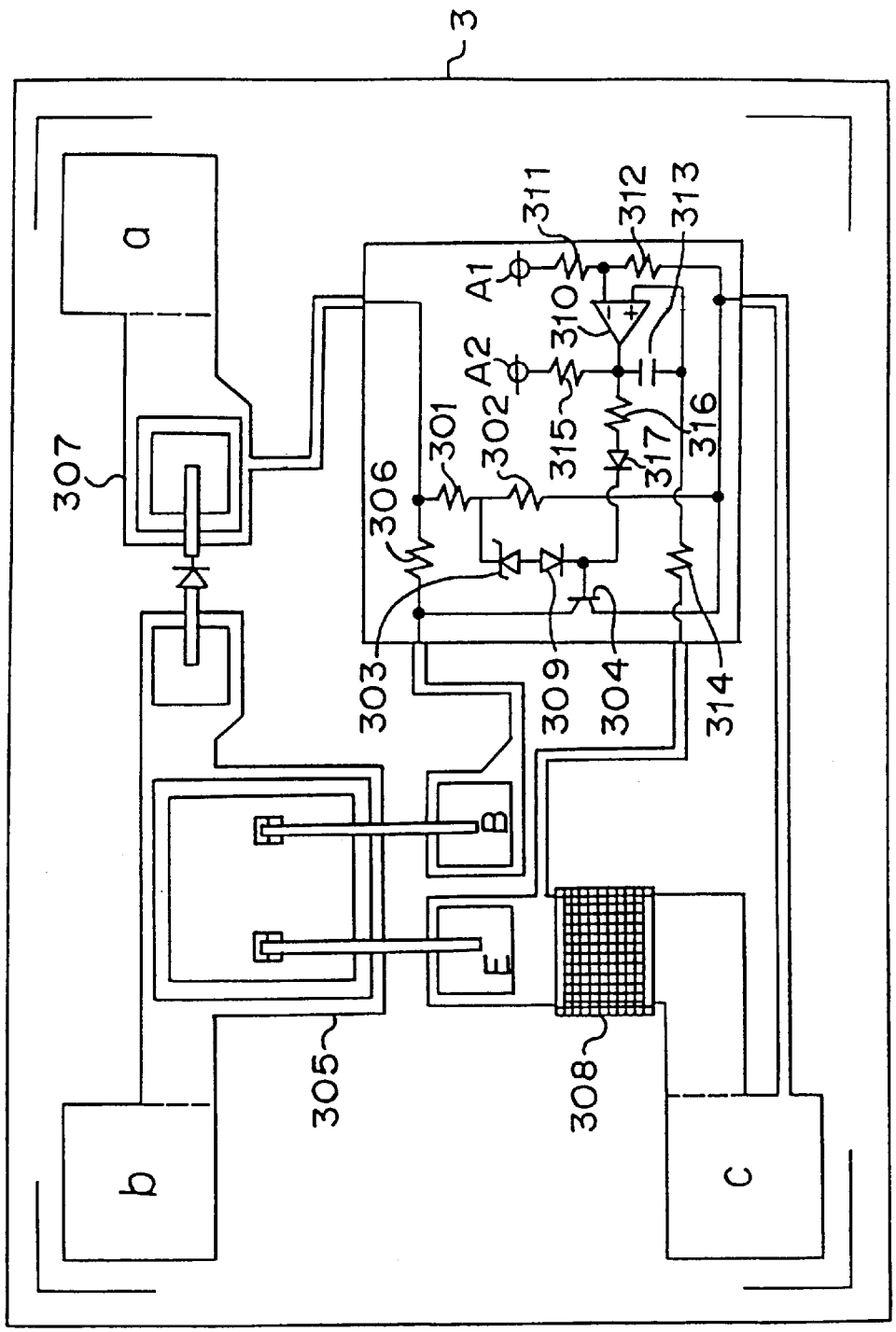
FIG. 3 is a schematic diagram showing the voltage regulator of the conventional control device.

An embodiment according to the present invention will be described. In FIG. 1, there is shown a voltage regulator 3 according to the embodiment, which is constructed as a hybrid integrated circuit like the conventional control device, and wherein a transistor 305, a surge absorbing diode 307 and a field current detecting resistor 308 are used as discrete elements, and other parts are constituted as an IC. The voltage regulator includes a power source terminal "a", a field current controlling terminal "b" and a ground (earth) terminal "c" as terminals for external connection. The field current detecting resistor 308 and the IC have respective ground (earth) patterns coupled at a location upstream of a terminal portion of the ground terminal "c" for external connection, i.e. at the side of the field current detecting resistor 308.

The voltage regulator thus constructed works like the conventional controlling device stated earlier. When lead wires for taking out signals from the voltage regulator are coupled by soldering, contact resistance varies depending on what soldering is made. However, even if the resistance value of contact resistance varies depending on what soldering is made, the resistance value of the contact resistance between the ground pattern of the field current detecting resistance 308 and the ground pattern of the IC remain the same because the ground pattern of the field current detecting resistor 308 and the ground pattern of the IC are coupled at a location upstream of the terminal portion of the ground terminal "c" as stated earlier. This arrangement can prevent the field current detecting resistor 308 and a voltage dividing resistor 312 from being unbalanced to make a ground potential for field current detection stable, limit the field current adequately as stated earlier to restrict the field current correctly, prevent generator output from being extraordinarily raised, and prevent an electrical system from being damaged due to overvoltage or overcharge of a battery.

Obviously, numerous modifications and variations of the present invention are possible in light of the above teachings. It is therefore to be understood that within the scope of the appended claims, the invention may be practiced otherwise than as specifically described herein.

What is claimed is:

1. A control device for a vehicle generator comprising:

a semiconductor switching element for turning on and off a field current which flows in a field winding of a generator driven by a vehicle internal combustion engine, thereby determining an output voltage of the generator;

a control unit for outputting a control signal for turning on and off the semiconductor switching element so as to control the output voltage of the generator;

a field current detecting element for detecting the field current;

wherein the control unit includes field current limiting means for outputting the control signal, depending on output from the field current detecting element;

the field current detecting element and the field current limiting means are constituted as a hybrid integrated circuit; and the field current detecting element and the field current limiting means have respective ground patterns coupled to each other at a location other than a ground terminal of the hybrid integrated circuit.

2. A control device for a generator comprising:

first means for turning on and off flow of a field current in a field winding of the generator to control an output voltage of the generator;

a field current detecting element for detecting the field current and outputting a signal indicating the detected field current;

second means for controlling said first means to turn on and off the flow of the field current, the second means including field current limiting means for outputting the control signal, depending on the signal output from the field current detecting element;

wherein the field current detecting element and the field current limiting means are constituted as a hybrid integrated circuit; and wherein the field current detecting element and the field current limiting means have respective ground patterns coupled to each other at a location other than a ground terminal of the hybrid integrated circuit.

* * * * *